(12) United States Patent
Lee et al.

(10) Patent No.: US 11,244,809 B2
(45) Date of Patent: Feb. 8, 2022

(54) CONTROL METHOD OF DRIVING FREQUENCY OF PULSED VARIABLE FREQUENCY RF GENERATOR

(71) Applicant: MKS Korea Ltd., Yongin-si (KR)

(72) Inventors: Changhee Lee, Daejon (KR); Hanam Kim, Daejon (KR); Jongmin Kim, Sejong (KR); Jin Huh, Daejeon (KR); Ka Sing Leung, Hong Kong (CN)

(73) Assignee: MKS Korea Ltd., Yongin-Si (KR)

( * ) Notice: Subject to any disclaimer, the term of this patent is extended or adjusted under 35 U.S.C. 154(b) by 343 days.

(21) Appl. No.: 16/484,062

(22) PCT Filed: Jun. 27, 2019

(86) PCT No.: PCT/KR2019/007802
§ 371 (c)(1),
(2) Date: Aug. 6, 2019

(87) PCT Pub. No.: WO2020/162653
PCT Pub. Date: Aug. 13, 2020

(65) Prior Publication Data
US 2021/0335576 A1    Oct. 28, 2021

(30) Foreign Application Priority Data
Feb. 7, 2019 (KR) .................. 10-2019-0014594

(51) Int. Cl.
*H01J 37/32* (2006.01)
*H03H 7/38* (2006.01)

(52) U.S. Cl.
CPC .. *H01J 37/32183* (2013.01); *H01J 37/32146* (2013.01); *H01J 37/32165* (2013.01); *H03H 7/38* (2013.01)

(58) Field of Classification Search
CPC . H05B 45/37; H05B 45/325; H01J 37/32082; H01J 37/32146;
(Continued)

(56) References Cited

U.S. PATENT DOCUMENTS

| 6,259,615 B1 * | 7/2001 | Lin .................... H05B 41/2828 363/98 |
| 9,294,100 B2 | 3/2016 | Van Zyl |

(Continued)

FOREIGN PATENT DOCUMENTS

| EP | 2068441 B1 | 4/2011 |
| JP | 2009-124687 A | 6/2009 |

(Continued)

OTHER PUBLICATIONS

Extended European Search Report dated Mar. 23, 2020; European Patent Application No. 19191658.4-1206; 10 pgs. European Patent Office, Munich, Germany.

(Continued)

*Primary Examiner* — Tung X Le
(74) *Attorney, Agent, or Firm* — Andrew D. Fortney; Central California IP Group, P.C.

(57) ABSTRACT

A frequency tuning impedance matching method includes analyzing a start driving frequency, set by a user, and an RF output signal to vary a driving frequency. Specifically, a next frequency may be predicted using susceptance which is an imaginary part of measured admittance in an n-th pulse. Accordingly, impedance matching may be completed at high speed or an optimal frequency may be reached at high speed.

12 Claims, 16 Drawing Sheets

(58) Field of Classification Search
CPC ......... H01J 37/32174; H01J 37/32302; H02M 3/33507; H02M 3/33523; H02M 3/33592
See application file for complete search history.

(56) References Cited

U.S. PATENT DOCUMENTS

| | | | |
|---|---|---|---|
| 9,336,901 | B2 | 5/2016 | Drewery |
| 9,520,795 | B2* | 12/2016 | Stuler ............... H02M 3/33523 |
| 9,773,644 | B2 | 9/2017 | Van Zyl |
| 9,876,476 | B2 | 1/2018 | Coumou et al. |
| 10,270,418 | B2 | 4/2019 | Kim et al. |
| 2004/0160794 | A1* | 8/2004 | Lin ....................... H02M 7/523 363/98 |
| 2009/0237170 | A1 | 9/2009 | Van Zyl et al. |
| 2012/0242246 | A1* | 9/2012 | Naruo .................... H05B 45/14 315/283 |
| 2014/0155008 | A1 | 6/2014 | Van Zyl |
| 2015/0137905 | A1 | 5/2015 | Han |
| 2015/0262704 | A1 | 9/2015 | Drewery |
| 2015/0382442 | A1 | 12/2015 | Mueller et al. |
| 2016/0204757 | A1 | 7/2016 | Kim et al. |
| 2016/0276138 | A1 | 9/2016 | Van Zyl |
| 2017/0054418 | A1 | 2/2017 | Coumou et al. |
| 2018/0109230 | A1 | 4/2018 | Coumou et al. |
| 2020/0044569 | A1* | 2/2020 | Drda .................... H02M 1/088 |

FOREIGN PATENT DOCUMENTS

| | | |
|---|---|---|
| JP | 2015-521437 A | 7/2015 |
| JP | 2016-540455 A | 12/2016 |
| KR | 10-2010-0125376 A | 11/2010 |
| KR | 1020140058787 A | 5/2014 |
| KR | 1020150039725 A | 4/2015 |
| KR | 1020180031789 A | 3/2018 |
| WO | 2007053569 A1 | 5/2007 |
| WO | 2015046753 A1 | 4/2015 |

OTHER PUBLICATIONS

Office Action dated Jul. 6, 2021; Korean Patent Application No. 10-2019-0014594; 4 pgs.; Korean Intellectual Property Office, Daejeon, Korea.
Office Action dated Jun. 15, 2021; Japanese Patent Application No. 2019-547117; 3 pgs.; Japan Patent Office, Tokyo, Japan.
Melikyan Harutyun et al.; "Apparatus for Generating Plasma and Method for Matching Impedance Thereof"; Bibliographic data of KR20140058787 (A); May 15, 2014; 2 pgs.; http://engpat.kipris.or.kr.
International Search Report of PCT/KR2019/007802 dated Nov. 6, 2019; 3 pgs.; International Searching Authority/KR; Korean Intellectual Property Office, Daejeon, Republic of Korea.

* cited by examiner $Zi = (1+\Gamma i)/(1-\Gamma i)$
$y' = Z_0/Z' = g'+jb'$
$\Gamma' = \Gamma i \times e^{j\phi}$
$\phi = \omega(d/c)$

US 11,244,809 B2

CONTROL METHOD OF DRIVING FREQUENCY OF PULSED VARIABLE FREQUENCY RF GENERATOR

CROSS-REFERENCE TO RELATED APPLICATIONS

This application is a continuation of and claims priority to PCT/KR2019/007802 filed on Jun. 27, 2019, which claims priority to Korea Patent Application No. 10-2019-0014594 filed on Feb. 7, 2019, the entireties of which are both hereby incorporated by reference.

TECHNICAL FIELD

The present disclosure relates to a pulsed variable frequency RF generator and, more particularly, to a control method of a frequency of a pulse-type variable frequency RF generator for frequency tuning impedance matching.

BACKGROUND

Plasma is used in semiconductor manufacturing processes such as an etching process and a deposition process. A radio-frequency (RF) generator generates plasma by applying a high-power RF signal to a load of a chamber. The generated plasma processes a surface of a substrate to have a desired shape or deposits a thin film on the substrate.

In this case, the high-power RF signal is transmitted to the load of the chamber to generate plasma. To this end, impedance between the RF generator and the load of the chamber should be matched to transfer power of a signal without reflection. As a rapid impedance matching technique, the RF generator adjusts a driving frequency of an RF signal to perform impedance matching. In a frequency variable impedance matching method, impedance matching is usually performed at a level of several milliseconds (msec).

With the advance in semiconductor manufacturing process, an RF signal, applied to a load of a chamber, may be a pulsed RF signal having an intensity modulated at a constant period. Conventionally, the pulsed RF signal is turned on/off at a pulse frequency of several hundred Hz to several kHz lower than a driving frequency of several MHz to several tens MHz. As the pulse frequency is increased to reduce an on-time period of several milliseconds or less, rapid control of a driving frequency of the RF signal is required for pulse impedance matching. When the pulse frequency increases to several kHz or higher, the on-time period decreases to 1 msec or less. Therefore, it is difficult to complete impedance matching due to insufficient time to adjust the driving frequency of the RF signal. As a result, the plasma is unstable.

SUMMARY

An aspect of the present disclosure is to provide a control method of a driving frequency of a pulsed RF generator and an impedance matching method.

According to an aspect of the present disclosure, a pulsed variable frequency RF generator according to an example embodiment provides RF power to a load as a pulse of an ON-time period T_ON and an OFF-time period T_OFF, which are alternate, and includes a control loop varying a driving frequency in the ON-time period T_ON. A control method of a driving frequency of the pulsed variable frequency generator includes varying a driving frequency f(n, m) in an ON-time period T_ON(n) of an n-th pulse; predicting a driving frequency of an ON-time period T_ON(n+1) of an (n+1)-th pulse using admittance of the ON-time period T_ON(n) of the n-th pulse; and providing an RF output of the pulsed variable frequency RF generator as the predicted driving frequency f(n+1,1) in the ON-time T_ON(n+1) of the (n+1)-th pulse. f(n,m) is a driving frequency in an m-th processing number in the ON-time period T_ON(n) of the n-th pulse, n denotes a sequence number of a pulse, m is a positive integer of 1 to q, and m denotes an index indicating the processing number of the control loop for varying a driving frequency in the ON-time period T_ON.

In an example embodiment, the varying a driving frequency f(n,m) in an ON-time period T_ON(n) of an n-th pulse may include a first step of measuring an RF current signal I and an RF voltage signal V at an output terminal of the pulsed variable frequency RF generator in the ON-time period T_ON(n) of the n-th pulse; a second step of calculating impedance Zi and a reflection coefficient Γi at the output terminal of the pulsed variable frequency RF generator by using the RF current signal I and the RF voltage signal V in the ON-time period T_ON(n) of the n-th pulse, a phase-shifted reflection coefficient Γ' reflecting a phase caused by a transmission line, and phase-shifted admittance y'; and a third step of selecting an increasing or decreasing direction of the driving frequency of the pulsed variable frequency RF generator depending on a sign of an imaginary part Im(Γ') of the phase-shifted reflection coefficient in the ON-time period T_ON(n) of the n-th pulse and varying the driving frequency. The first step, the second step, and the third step may be repeated until the ON-time period T_ON(n) of the n-th pulse is finished.

In an example embodiment, the predicting a driving frequency of an ON-time period T_ON(n+1) of an (n+1)-th pulse using admittance of the ON-time period T_ON(n) of the n-th pulse may include: linearly fitting an imaginary part of the phase-shifted admittance y' in an n-th ON-time period T_ON(n) with respect to the driving frequency; and setting a frequency corresponding to a point, in which the imaginary part of the phase-shifted admittance y' is zero (0), as a predicted driving frequency f(n+1,1) of an ON-time period T_ON(n+1) of an (n+1)-th pulse.

In an example embodiment, a prediction driving frequency f(n+1,m=1) of the ON-time period T_ON(n+1) of the (n+1)-th pulse may be given as follows:

$$f(n+1,m=1)=f(n,m=q)-b'(n,m=q)[df/db']$$

$$df/db'=[f(n,m=q)-f(n,m=r)]/[b'(n,m=q)-b'(n,m=r)],$$

where f(n,m=r) denotes a driving frequency at a predetermined r-th processing number in the ON-time period T_ON(n) of an n-th pulse, b'(n,m=r) denotes susceptance which is the imaginary part of the phase-shifted admittance y' at the predetermined r-th processing number of the ON-time period T_ON(n) of the n-th pulse, f(n,m=q) denotes a driving frequency at the last processing number in the ON-time period T_ON(n) of the n-th pulse, and b'(n,m=q) denotes susceptance which is the imaginary part of the admittance y' of the last processing number q of the ON-time period T_ON(n) of the n-th pulse.

In an example embodiment, r may be a positive integer of 3 to q−1.

In an example embodiment, the control method may further include: determining an optimal condition for impedance matching using the phase-shifted reflection coefficient Γ'. The optimal condition may be determined by an absolute value |Γ'| of the phase-shifted reflection coefficient or a magnitude of the imaginary part Im(Γ') of the phase-shifted reflection coefficient Γ'. When the determined condition is the optimal condition, the first step of measuring an RF current signal I and an RF voltage signal V at an output terminal of the pulsed variable frequency RF generator may be performed after increasing an index m indicating a processing number for variation of a driving frequency. When the determined condition is not the optimal condition, the third step of varying the driving frequency may be performed.

In an example embodiment, in the third step of selecting an increasing or decreasing direction of the driving frequency of the pulsed variable frequency RF generator depending on a sign of an imaginary part Im(Γ') of the phase-shifted reflection coefficient in the ON-time period T_ON(n) of the n-th pulse and varying the driving frequency, a driving frequency may be increased when the imaginary part Im(Γ') of the phase-shifted reflection coefficient has a positive value, and a driving frequency may be decreased when the imaginary part Im(Γ') of the phase-shifted reflection coefficient has a negative value.

In an example embodiment, a variation amount of the driving frequency in the n-th ON-time period T_ON(n) may depend on an absolute value of the phase-shifted reflection coefficient or an absolute value of the imaginary part of the phase-shifted reflection coefficient.

In an example embodiment, the control method may further include: changing a reactance value of a variable reactance element of an impedance matching network, which is disposed between the pulsed variable frequency RF generator and the load and includes at least two variable reactance elements, to set a real part Re(Zi) of the impedance in the load direction at the output terminal of the pulsed variable frequency RF generator as characteristic impedance of a transmission line.

In an example embodiment, the control method may further include a plasma stabilizing step, including an ON-time period T_ON and an OFF-time period T_OFF which are alternate, without variation of the driving frequency of the pulsed variable frequency RF generator.

According to another aspect of the present disclosure, a pulsed variable frequency RF power system according to an example embodiment includes a pulsed variable frequency RF generator configured to supply RF power to a load as a pulse of an ON-time period T_ON and an OFF-time period T_OFF which are alternate. The pulsed variable RF generator includes an impedance sensing unit disposed at an output terminal of the pulsed variable frequency RF generator in an n-th ON-time period T_ON(n) to sense an RF current signal and an RF voltage signal; an impedance processing unit configured to calculate impedance Zi and a reflection coefficient Γi by using the RF current signal and the RF voltage signal at the output terminal of the pulsed variable frequency RF generator, a phase-shifted reflection coefficient Γ' by a transmission line between the load and the pulsed variable frequency RF generator, and phase-shifted admittance y' converted from the phase-shifted reflection coefficient Γ' in the n-th ON-time period T_ON(n); a driving frequency prediction unit configured to predict a next ON-time period T_ON(n+1) using the phase-shifted admittance y' with respect to a driving frequency; a driving frequency control unit configured to receive the predicted driving frequency and set the predicted driving frequency as a start driving frequency of the next ON-time period T_ON(n+1) and controls a driving frequency using the phase-shifted reflection coefficient Γ'; a pulse generator configured to generate a pulse signal and divide the ON-time period T_ON and the OFF-time period T_OFF and to provide the pulse signal to the driving frequency prediction unit and the driving frequency control unit; and an RF amplifier configured to amplify a sinusoidal wave of a driving frequency of the driving frequency control unit.

In an example embodiment, the driving frequency prediction unit may linearly fit an imaginary part of phase-shifted admittance y' with respect to a driving frequency, in an n-th ON-time period T_ON(n) to set a frequency, corresponding to a point in which the imaginary part of the phase-shifted admittance y' is zero, as a prediction driving frequency.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1:
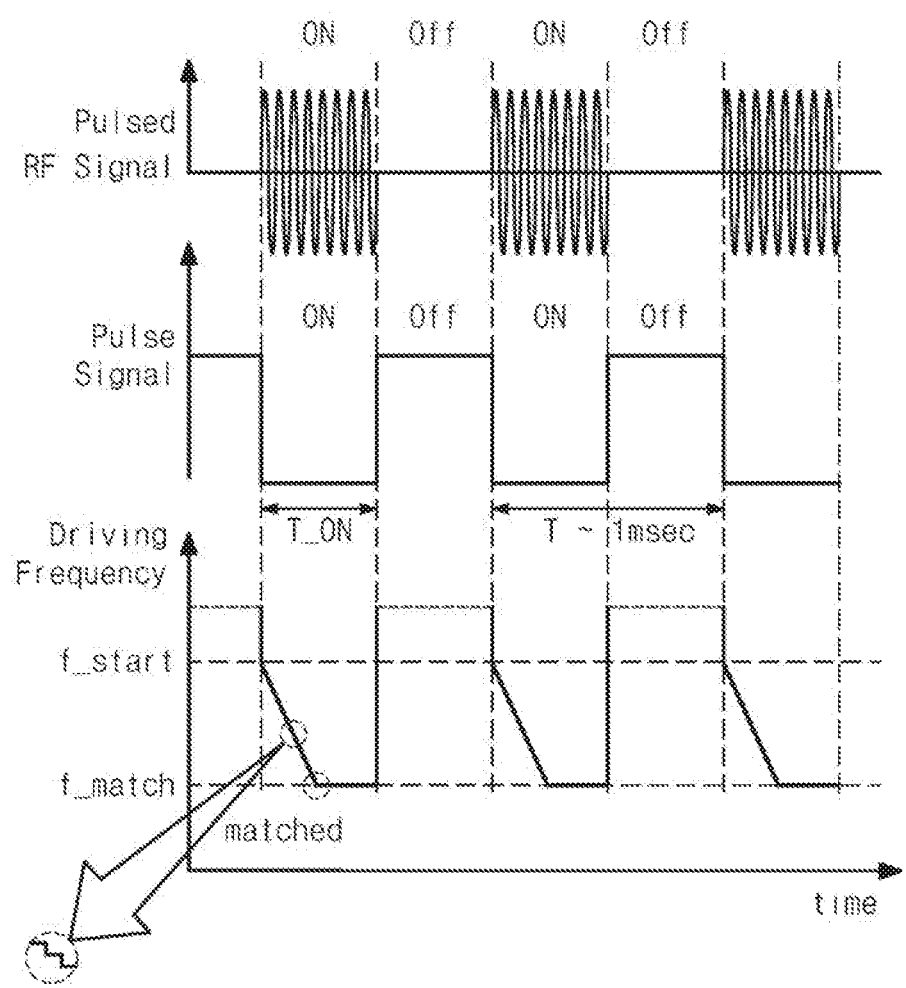
FIG. 1 illustrates an example of performing impedance matching by conventional frequency tuning or frequency variation.

FIG. 1 illustrates an example of performing impedance matching by conventional frequency tuning or frequency variation.

Referring to FIG. 1, a variable frequency RF power supply transfers RF power to a load through an ON-time period T_ON and an OFF-time period T_OFF which are alternate. When the ON-time period T_ON is sufficient to be longer than several milliseconds, a driving frequency of the variable frequency RF power supply starts at a start driving frequency f_start in each ON-time period T_ON to complete impedance matching at a matching frequency f_match within a predetermined time. Frequency tuning is normally performed within an ON-time period of a single pulse.

Figure 2:
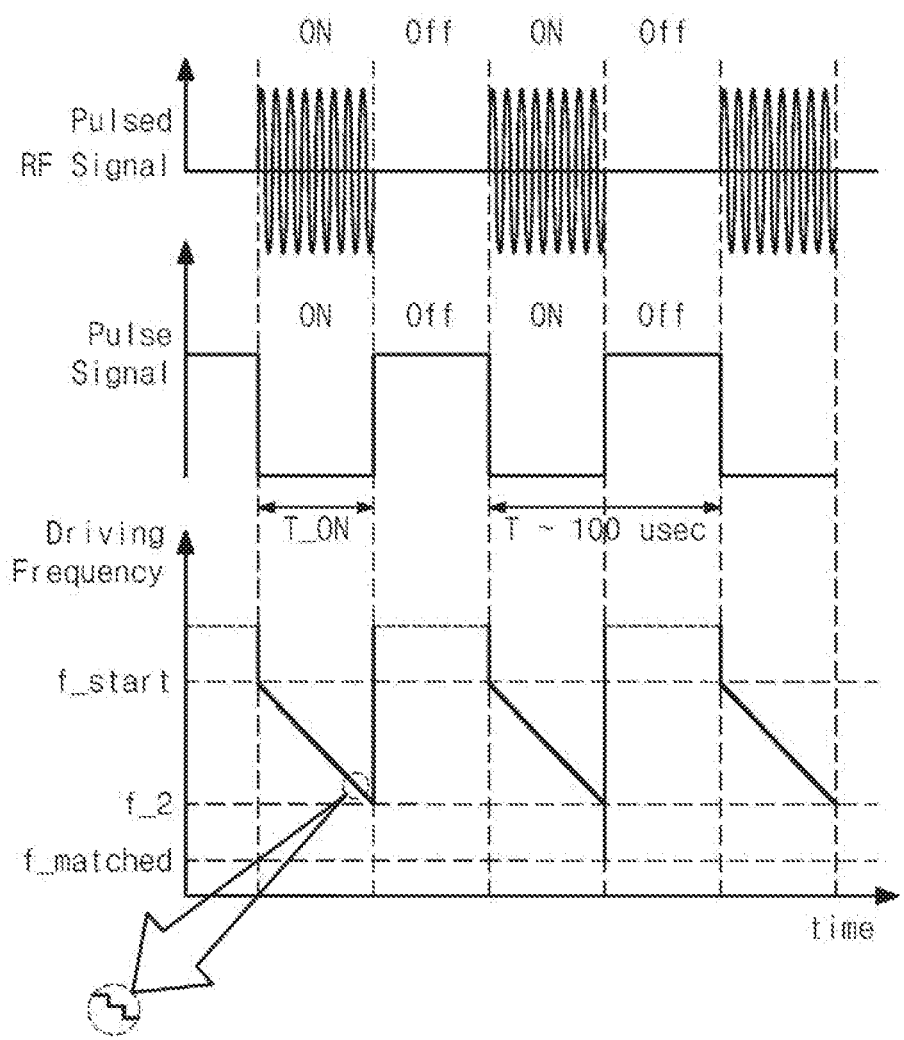
FIG. 2 illustrates an example of performing impedance matching by conventional frequency tuning or frequency variation.

FIG. 2 illustrates an example of performing impedance matching by conventional frequency tuning or frequency variation.

Referring to FIG. 2, a variable frequency RF power supply transfers RF power to a load through an ON-time period T_ON and an OFF-time period T_OFF which are alternate. When the ON-time period T_ON is insufficient to be shorter than 50 μsec, a driving frequency of the variable frequency RF power supply starts at a start driving frequency f_start in each ON-time period T_ON and does not reach a matching frequency f_match, and thus, impedance matching may not be completed.

Figure 3:
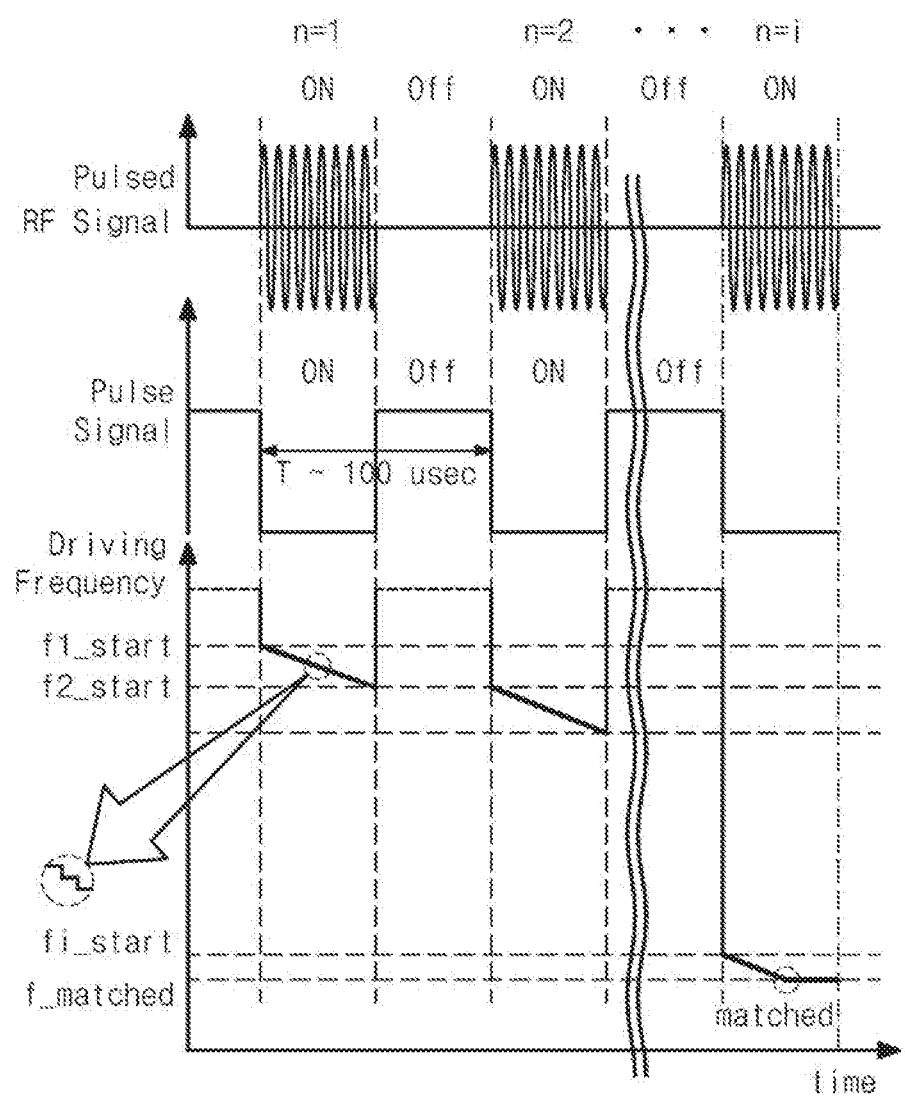
FIG. 3 illustrates an example of performing impedance matching by conventional frequency tuning or frequency variation.

FIG. 3 illustrates an example of performing impedance matching by conventional frequency tuning or frequency variation.

Referring to FIG. 3, a variable frequency RF power supply transfers RF power to a load through an ON-time period T_ON and an OFF-time period T_OFF which are alternate. When the ON-time period T_ON is insufficient to be shorter than 50 ρsec, a driving frequency of the variable frequency RF power supply starts at a first starting driving frequency f1_start in a first on-time period T_ON and does not reach a matching frequency f_match within the first on-time period, and thus, impedance matching may not be completed. However, in a second ON-time period T_ON, a final frequency of the first ON-time period may be set to be a second start driving frequency to perform impedance matching while successively varying the driving frequency in the second ON-time period. As a result, the frequency varies in an i-th ON-time period and reaches the matching frequency f_match to complete impedance matching.

However, such an impedance matching method requires a plurality of pulses to complete frequency variable impedance matching. Accordingly, there is a need for a high-speed and efficient impedance matching method of a pulsed variable frequency RF generator.

In a frequency tuning impedance matching method according to an example embodiment, a start driving frequency and an RF out signal, set by a user, are analyzed to vary a driving frequency. Specifically, a next frequency may be predicted using a susceptance, an imaginary part of admittance measured in an n-th pulse, to rapidly complete impedance matching or to rapidly reach an optimal frequency.

Embodiments of the present disclosure will now be described below more fully with reference to accompanying drawings. The present disclosure may, however, be embodied in different forms and should not be construed as limited to the embodiments set forth herein. Rather, these embodiments are provided so that this disclosure will be thorough and complete, and will fully convey the scope of the present invention to those skilled in the art.

Figure 4:
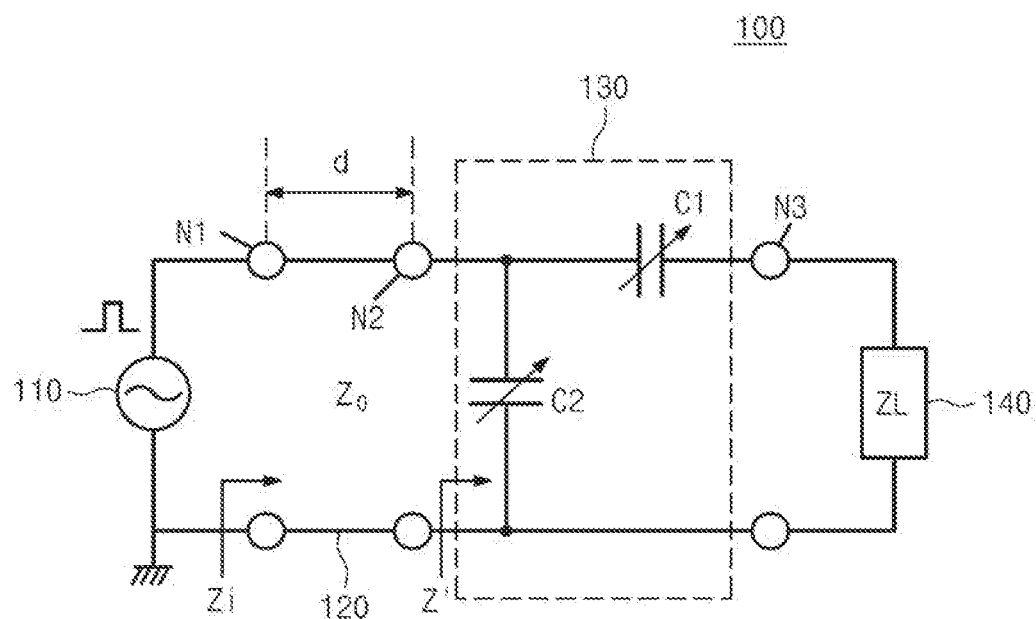
FIG. 4 is a circuit diagram of a pulsed variable frequency RF generator and a load according to an example embodiment of the present disclosure.

FIG. 4 is a circuit diagram of a pulsed variable frequency RF generator and a load according to an example embodiment of the present disclosure.

Figure 5:
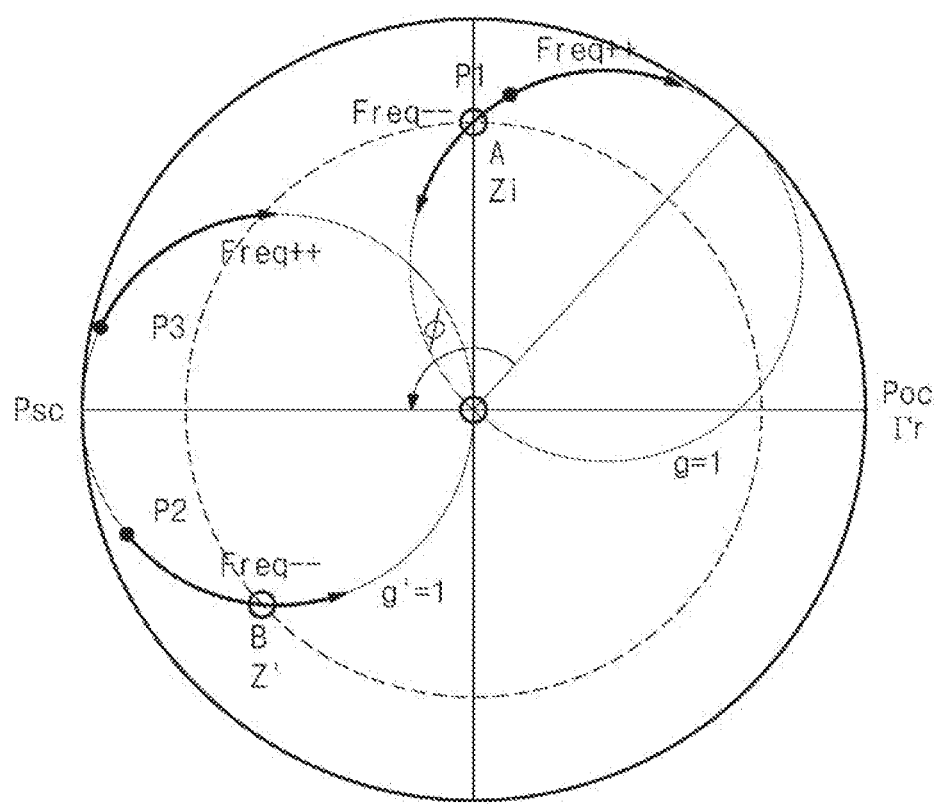
FIG. 5 is a Smith chart illustrating impedance when viewing a load at an output terminal of the pulsed variable frequency RF generator in FIG. 4.

FIG. 5 is a Smith chart illustrating impedance when viewing a load at an output terminal of the pulsed variable frequency RF generator in FIG. 4.

Referring to FIGS. 4 and 5, a pulsed variable frequency RF generator 110 transfers RF power to a load 140 through an impedance matching network 130 and a transmission line 120. Impedance when viewing the impedance matching network 130 and the load 140 is Z'. Impedance when viewing the transmission line 120, the impedance matching network 130, and the load 140 at an output terminal N1 of the pulsed variable frequency RF generator 110 is Zi. The first impedance Zi may be converted into first admittance (Yi=1/Zi), and the second impedance Z' may be converted into a second admittance Y'. The second admittance Y' may be expressed by a normalized admittance (y'=Zo Y'=g'+ib'), where Zo denotes characteristic impedance of the transmission line 120, g' denotes conductance, and b' is susceptance.

An impedance matching point is a point, at which a reflection coefficient Γ is zero, as the origin of a Smith chart. When a real part of the second impedance Z', viewed at the input terminal N2 of the impedance matching network 130, is fixed to 50 ohms, a conductance circle with g'=1 is a circle with the origin and Psc as a diameter. When a driving frequency of the pulsed variable frequency RF generator 110 is increased, a point P3 of the Smith chart rotates clockwise along a conductance circle with g'=1. When the driving frequency of the pulsed variable frequency RF generator 110 is decreased, a point P2 of the Smith chart rotates clockwise along the conductance circle with g=1.

The first impedance Zi further has a phase difference φ, caused by the transmission line 120, as compared to the second impedance Z'. The conductance circle with g'=1 rotates clockwise for the second impedance Z' on the Smith chart. The phase difference φ is in proportion to a driving angular frequency ω and a length d of the transmission line 120 and is in inverse proportion to speed c of an electromagnetic wave. The characteristic impedance of the transmission line 120 is $Z_0$.

When an imaginary part of a second reflection coefficient Γ" has a positive value, the driving frequency is increased such that the imaginary part moves to the origin of the Smith chart along a minimum path to complete impedance matching. Meanwhile, when the imaginary part of the second reflection coefficient Γ" has a negative value, the driving frequency is decreased such that the imaginary part moves to the origin of the Smith chart along the minimum path to complete impedance matching.

A point P1, present on the conductance circuit with g=1, rotates clockwise for a first impedance Zi when the driving frequency is increased and rotates counterclockwise for the first impedance Zi when the driving frequency is decreased.

Accordingly, a reflection coefficient Γi may rotate by the phase difference φ to easily determine increase or decrease in the driving frequency for frequency tuning impedance matching. Specifically, the point A may be converted into a point B by phase shift. Thus, the increase or decrease in the drive frequency may be determined depending on a sign of the imaginary part of the reflection coefficient Γ".

When the driving frequency is increased at a position P1 corresponding to the first impedance Zi, the impedance is moved clockwise along a circle, passing through the position P1, depending on the impedance characteristics. When the driving frequency is decreased, the impedance is moved counterclockwise. When the drive frequency is tuned based on such a principle and the impedance moves to an origin on the Smith chart, impedance matching is completed.

To complete impedance matching at the shortest distance from the position P1, it is advantageous to decrease a frequency when the position P1 is disposed above a line passing through the origin on the Smith chart and the center of a characteristic circle of the position P1 and to increase a frequency when the position P1 is disposed below the line.

To easily find a shortest trajectory, when an angle φ is provided to the conductance circle with g=1, a line, passing through the center of the circle and the center of the Smith chart, matches an X axis (an axis of the real part of the reflection coefficient). Accordingly, an optimal trajectory direction may be determined depending on whether an imaginary component of the reflection coefficient G' is positive or negative. The reflection coefficient of the position P1 is multiplied by a complex number having a phase of φ and a size of 1. Accordingly, it is advantageous to increase the driving frequency in the P3 position where an imaginary component of the reflection coefficient Γ' is positive. In addition, it is advantageous to decrease the driving frequency in a position P2 where the imaginary component of the reflection coefficient Γ' is negative.

Figure 6:
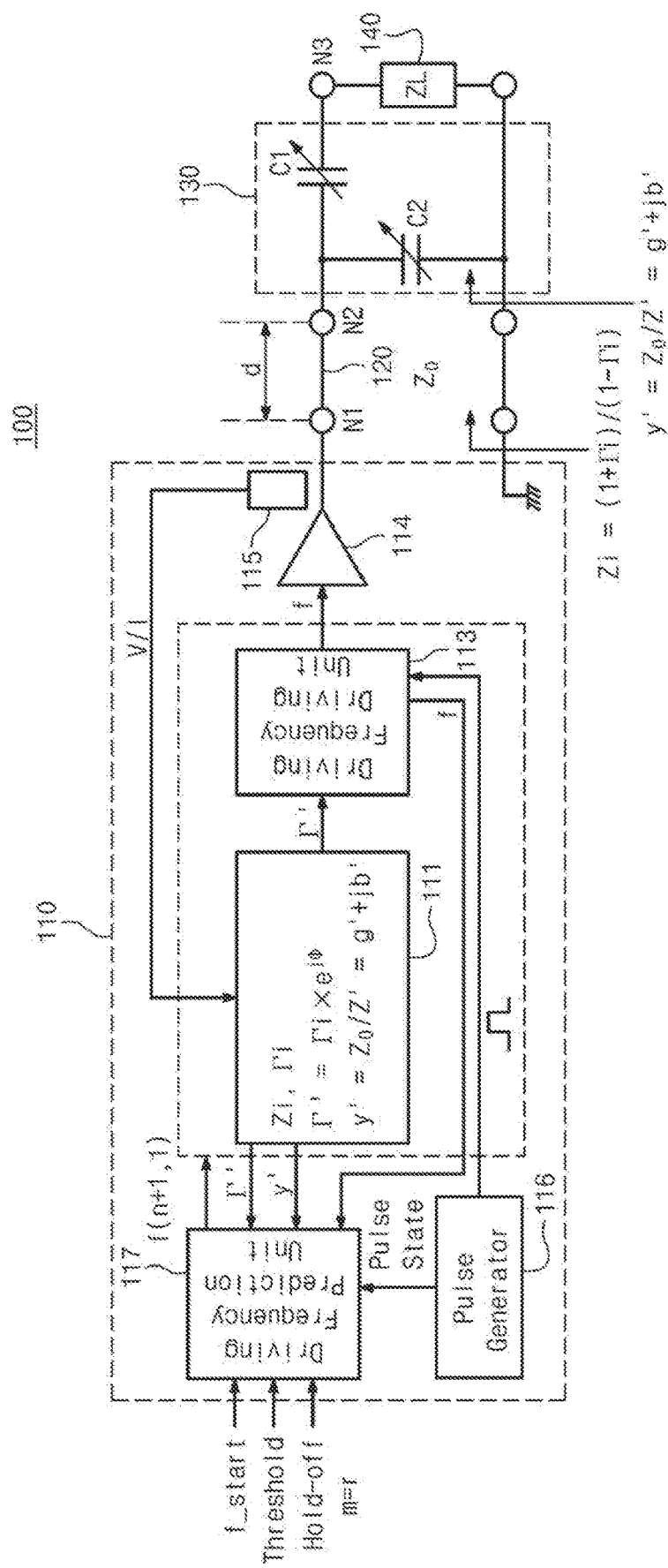
FIG. 6 is a circuit diagram of a pulsed variable frequency RF generator and a load according to another example embodiment of the present disclosure.

FIG. 6 is a circuit diagram of a pulsed variable frequency RF generator and a load according to another example embodiment of the present disclosure.

Figure 7:
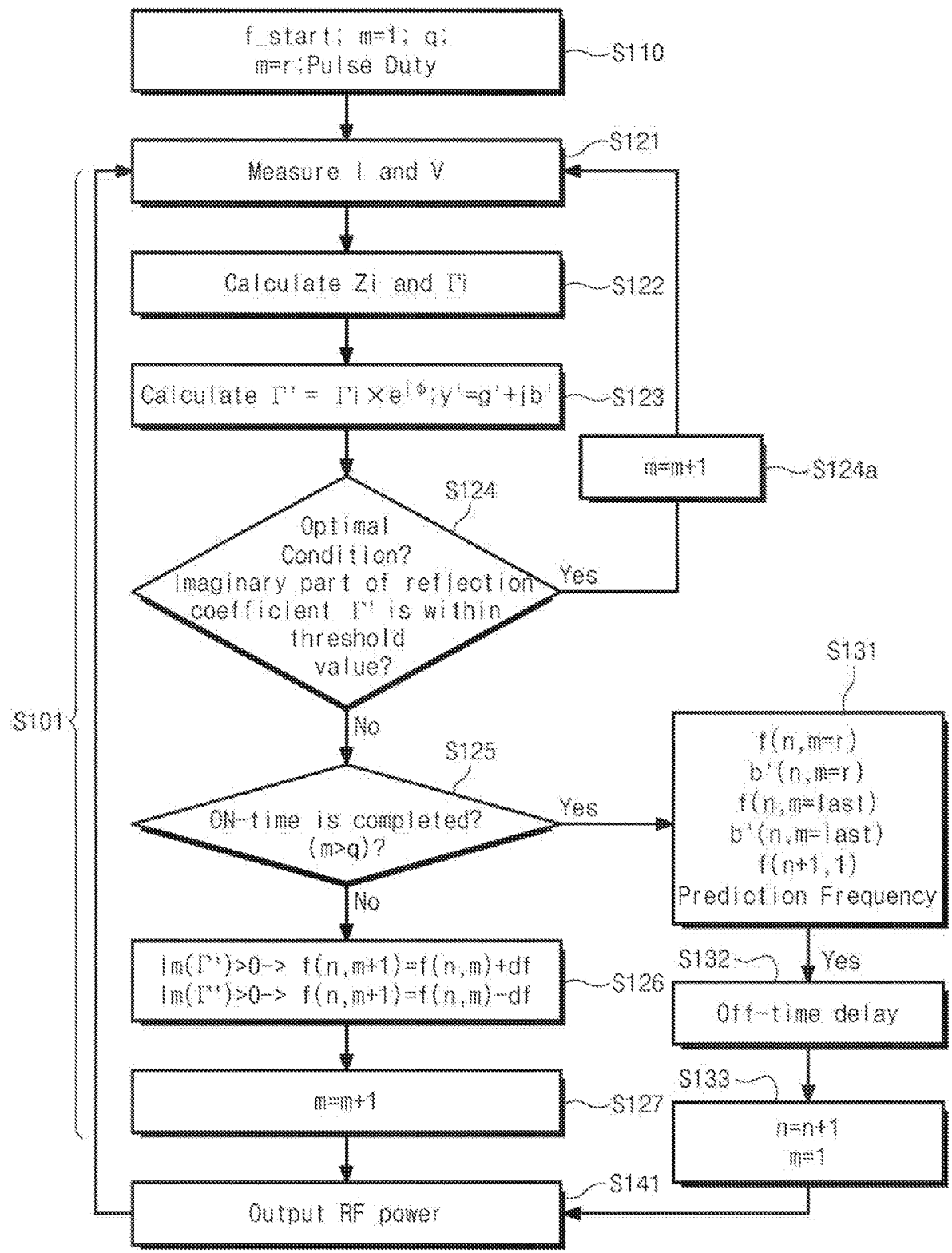
FIG. 7 is a flowchart illustrating an operation of the pulsed variable frequency RF generator in FIG. 6.

FIG. 7 is a flowchart illustrating an operation of the pulsed variable frequency RF generator in FIG. 6.

Figure 8:
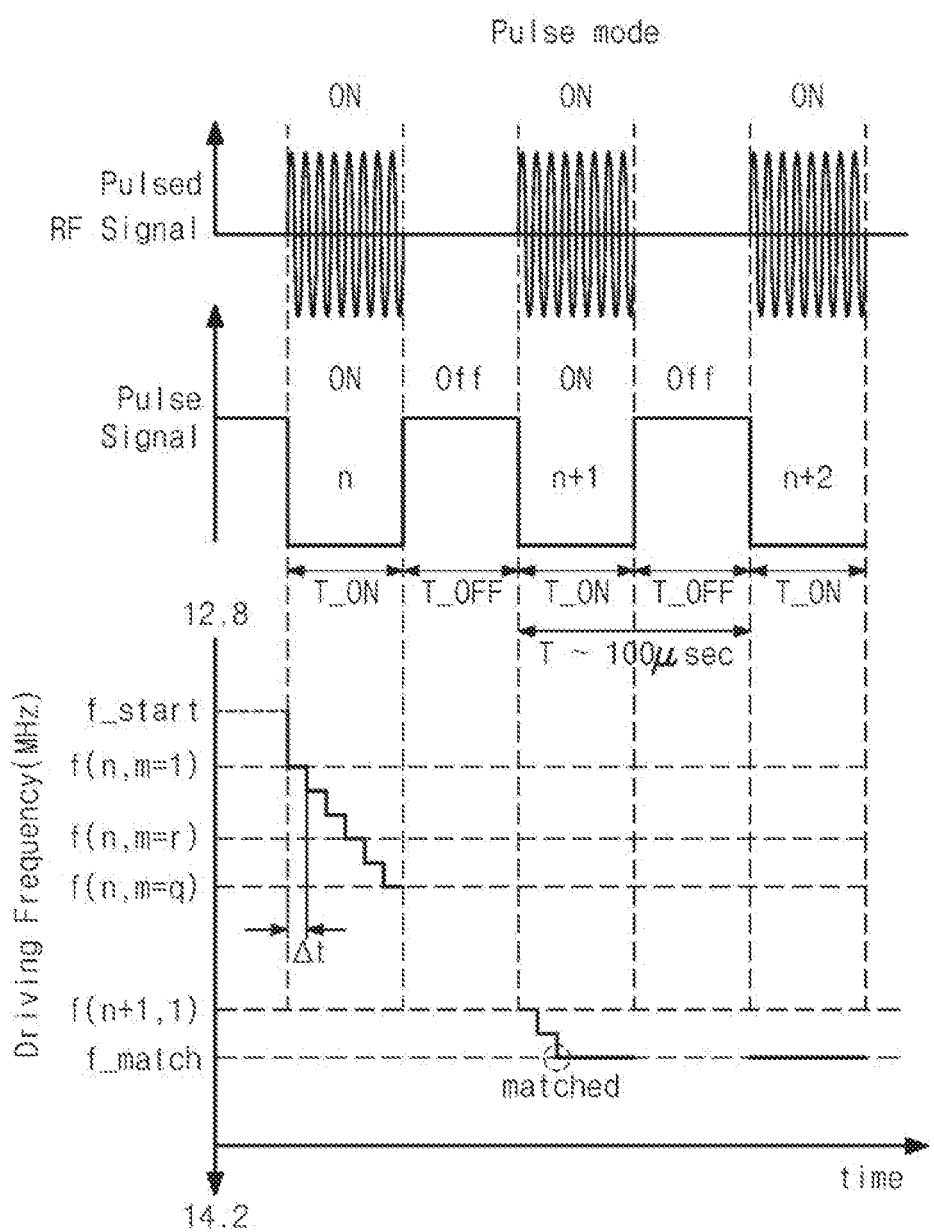
FIG. 8 illustrates a pulsed RF signal, a pulse generator pulse state signal, and a driving frequency of the pulsed variable frequency RF generator in FIG. 6.

FIG. 8 illustrates a pulsed RF signal, a pulse generator pulse state signal, and a driving frequency of the pulsed variable frequency RF generator in FIG. 6.

Figure 9:
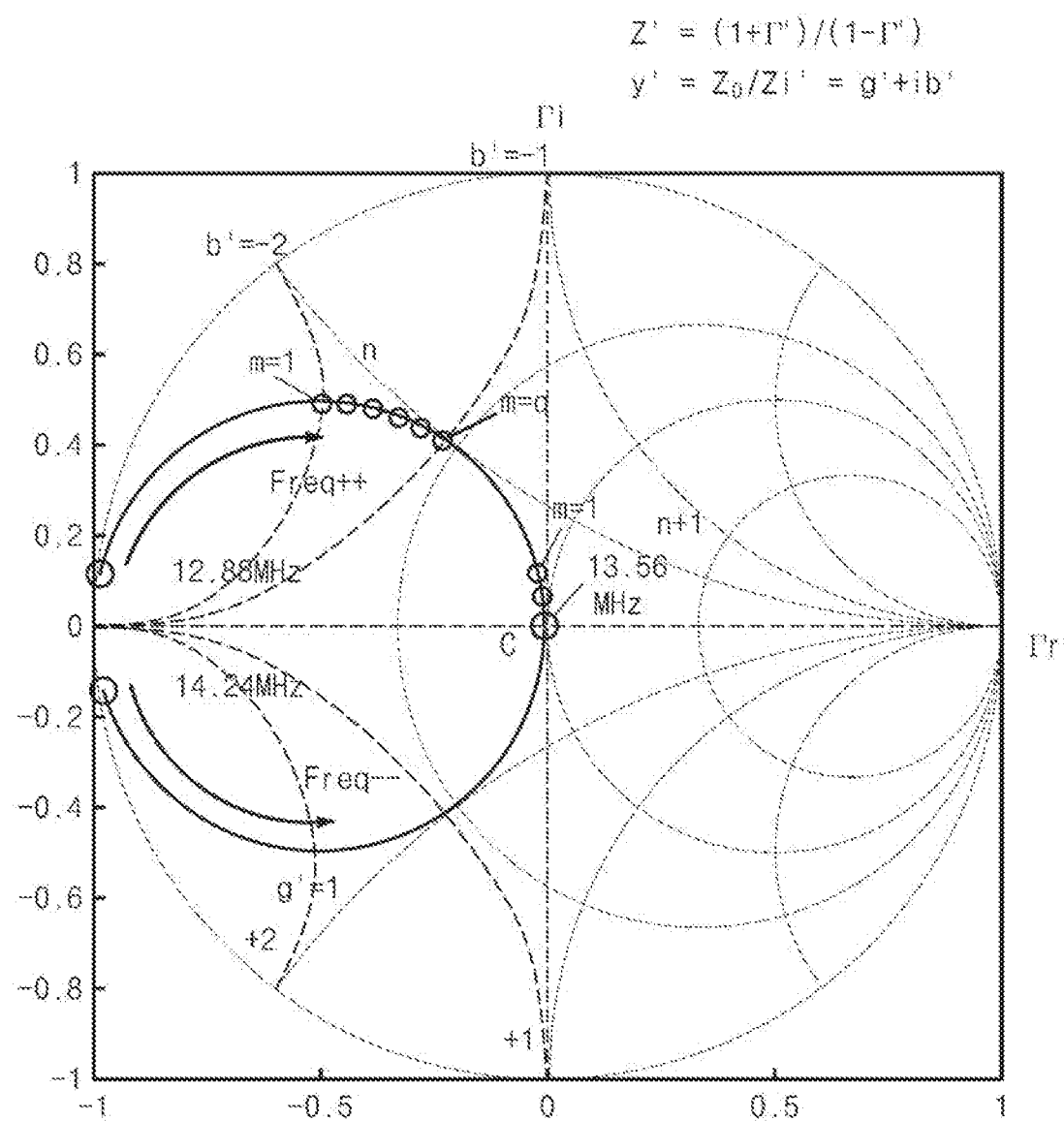
FIG. 9 illustrates admittance, depending on a driving frequency, on a Smith chart.

FIG. 9 illustrates admittance, depending on a driving frequency, on a Smith chart.

Figure 10:
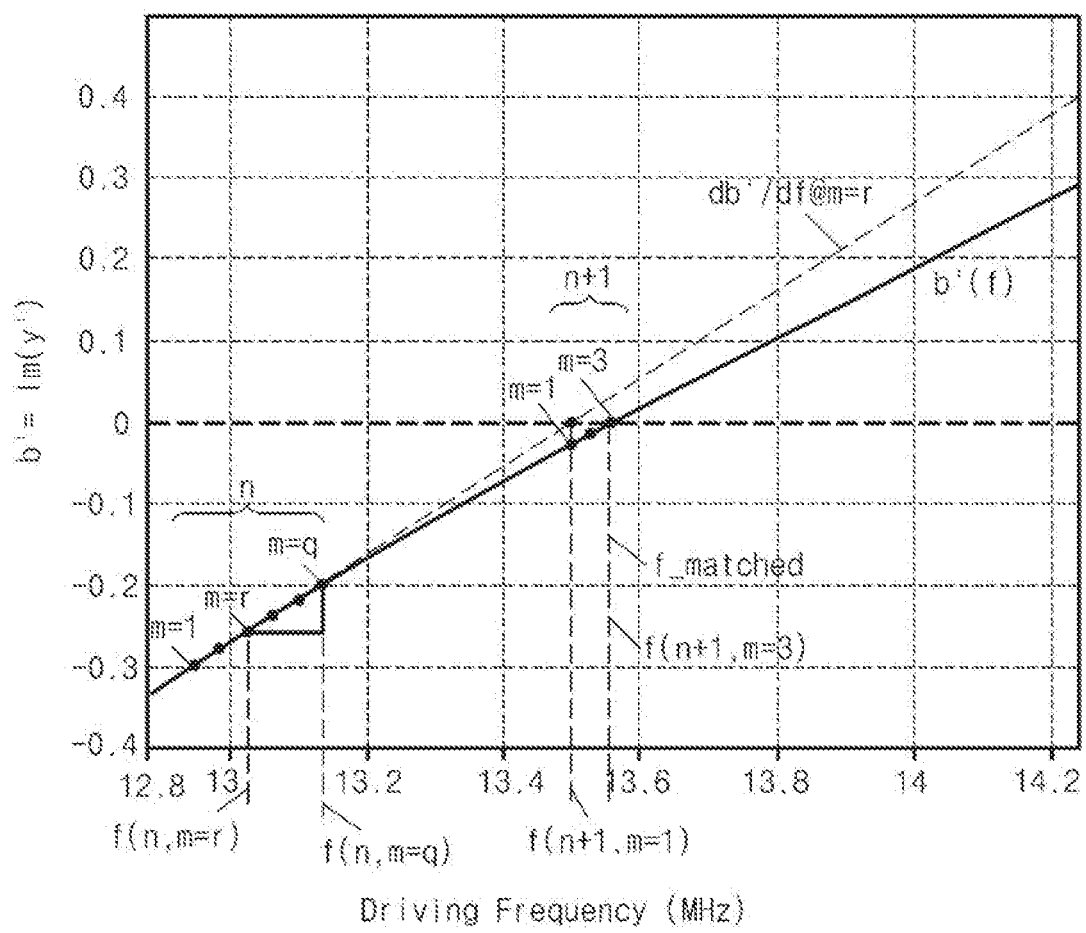
FIG. 10 is an imaginary part depending on a driving frequency.

FIG. 10 is an imaginary part depending on a driving frequency.

Figure 11:
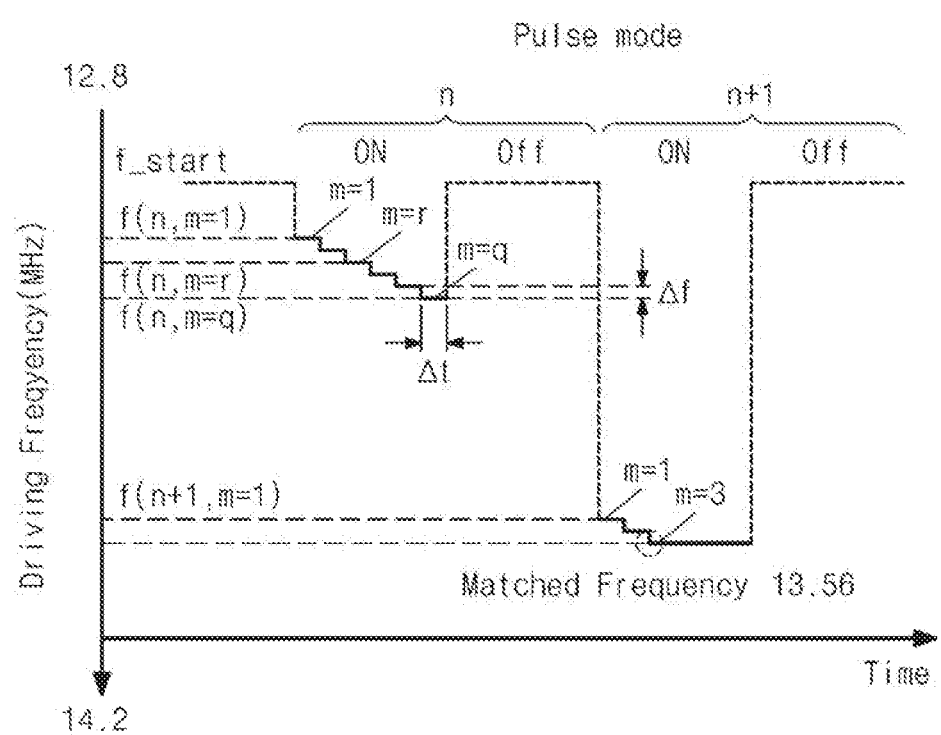
FIG. 11 illustrates variation of a driving frequency depending on operating time of a control loop.

FIG. 11 illustrates variation of a driving frequency depending on operating time of a control loop.

Referring to FIGS. 6 to 11, a pulsed variable frequency RF power system 100 includes a pulsed variable frequency RF generator 110 and an impedance matching network 130 disposed between the pulsed variable frequency RF generator 110 and a load 140. The pulsed variable frequency RF generator 110 provides RF power to the load 140 in an ON-time period T_ON and an OFF-time period T_OFF which are alternate. The impedance matching network 130 includes at least two variable reactance elements C1 and C2. A reactance value of the variable reactance element of the impedance matching network 130 is changed to adjust impedance in a direction of the load 140.

The pulse type variable frequency RF generator 110 includes an impedance sensing unit 115, an impedance processing unit 111, a driving frequency prediction unit 117, a driving frequency control unit 113, a pulse generator 116, and an RF amplifier 114. The pulsed variable frequency RF generator 110 varies a driving frequency to operate at an impedance matching frequency or an optimal frequency at high speed.

The impedance sensing unit 115 is disposed at an output terminal N1 of the pulsed variable frequency RF generator 110 in an n-th ON-time period T_ON(n) to sense an RF current signal I and an RF voltage signal V (n being the order of a pulse).

The impedance processing unit 11*l* calculates impedance Zi and a reflection coefficient Γi at the output terminal N1 of the pulsed variable frequency RF generator 110 in the n-th ON-time period T_ON(n) by using the RF current signal I and the RF voltage signal V, a phase-shifted reflection coefficient Γ' by a transmission line 120 between the load 140 and the pulsed variable frequency RF generator 110, and phase-shifted admittance y' converted from the phase-shifted reflection coefficient Γ'.

The driving frequency prediction unit 117 predicts a driving frequency of a next ON-time period T_ON(n+1) using the phase-shifted admittance y' depending with respect to a driving frequency measured in the n-th ON-time period T_ON(n).

The driving frequency control unit 113 sets the predicted driving frequency as a start driving frequency of the next ON-time period T_ON(n+1) and controls a driving frequency using the phase-shifted reflection coefficient Γ'.

The pulse generator 116 generates a pulse signal to divide the ON-time period T_ON and the OFF-time period T_OFF and provides the pulse signal to the driving frequency prediction unit 117 and the driving frequency control unit 113.

The RF amplifier 114 amplifies a sinusoidal wave at a driving frequency of the driving frequency control unit to output an RF signal.

The load 140 may be an electrode, which generates capacitively-coupled plasma, or an antenna which generates inductively-coupled plasma. The load 140 may be mounted inside or outside a chamber in which a semiconductor process is performed. The load 140 may generate pulse plasma in synchronization with the pulse signal. The driving frequency may be several MHz to several tens of MHz. The pulse frequency may range from several kHz to several tens of kHz. An ON-Duty Ratio of the RF pulse may range from several percent to several tens of percent. The ON-time period T_ON may be less than 50 μsec. In detail, the ON-time period T_ON may be 100 usec or less.

The impedance matching network 130 may be classified into various types depending on connection methods of variable reactive elements. As an example, the impedance matching network 130 includes a first variable capacitor C1, connected in series to the load 140, and a second variable capacitor C2 connected in parallel to the first variable capacitor C1 and the load 140 connected in series. The impedance matching network 130 may be an L-type, an inverted L-type, a T-type, or a π-type impedance matching network. The impedance matching network 130 may be operated to perform impedance matching when the impedance matching, performed by tuning the driving frequency of the pulsed variable frequency RF generator 110, fails.

The impedance sensing unit 115 measures the RF current signal I and the RF voltage signal V at the output terminal N1 of the pulsed variable frequency RF generator 110 in a direction of the load 140. The RF current signal I and the RF voltage signal V may be sampled at a higher sampling rate than the driving frequency for a sampling time longer than a period of the driving frequency to be converted into a digital signal to be provided to the impedance processing unit 111.

The impedance processing unit 111 may calculate the impedance Li and/or the reflection coefficient Γi at the output terminal N1 of the pulsed variable frequency RF generator 110 using the RF current signal I and the RF voltage signal V. In addition, the impedance processing unit 111 may compensate for a phase difference φ caused by the length d of the transmission line 120. Specifically, the reflection coefficient Γi may be converted into a phase-shifted reflection coefficient Γ' when viewing the load 140 at the input terminal N2 of the impedance matching network 130 and is converted as follows:

$$\Gamma' = \Gamma i e^{j\varphi}$$

$$\varphi = \omega d/c \qquad \text{Equation 1}$$

where φ denotes a phase difference, d denotes a length of a transmission line, ω denotes a driving angular frequency, and c denotes speed of an electromagnetic wave on a transmission line. The transmission line 120 may be a coaxial cable. The phase-shifted reflection coefficient Γ' is a reflection coefficient when viewing the load 140 at the input N2 of the impedance matching network 130.

The impedance processing unit 111 may convert the phase-shifted reflection coefficient Γ' into phase-shifted admittance y'. The phase-shifted admittance y' may be given as follows:

$$y' = g' + jb' \qquad \text{Equation 2}$$

where g' denotes conductance and b' denotes susceptance.

The driving frequency control unit 113 may receive the phase-shifted reflection coefficient Γ'. The driving frequency control unit 113 may divide the ON-time period T_ON into a plurality of unit time Δt to vary the driving frequency every unit time Δt. The unit time Δt may be about 1 usec as on operating time of a control loop. Thus, the total number of control loops (q) is T_ON/Δt (q being a positive integer greater than or equal to 3).

The driving frequency control unit 113 may select increase and decrease directions of the driving frequency, depending on a sign of the imaginary part Im(Γ') of the phase-shifted reflection coefficient. Specifically, when the imaginary part Im(Γ') of the reflection coefficient has a positive value, the driving frequency may be increased by a frequency variation amount df. Meanwhile, when the imaginary part Im(Γ') of the reflection coefficient has a negative value, the driving frequency may be decreased by the frequency variation amount df. The frequency variation amount df may depends on a magnitude of the absolute value |Γ'| of the reflection coefficient or a magnitude of the imaginary part Im(Γ') of the reflection coefficient. For example, the frequency variation amount df may be in proportion to the magnitude of the absolute value of the reflection coefficient |Γ'| or the magnitude of the imaginary part Im(Γ') of the reflection coefficient. For example, the driving frequency control unit 113 may not vary the driving frequency when impedance matching is performed with the absolute value |Γ'| of the reflection coefficient less than or equal to the threshold value. The driving frequency controller 113 may adjust the frequency variation amount df depending on a degree of the impedance matching.

The driving frequency control unit 113 may use a proportional-integral-derivative control scheme. The driving frequency control unit 113 may output the driving frequency in the ON-time period T_ON and may not output the driving frequency in the OFF-time period T_OFF.

The RF amplifier 114 may provide an RF output at the driving frequency. The RF amplifier 114 may be an RF power amplifier. An output of the RF amplifier 114 may be several hundreds of watts to tens of kilowatts.

The pulse generator 116 may provide a pulse signal for identifying the ON-time period T_ON and the OFF-time period T_OFF to the driving frequency control unit 113 and the driving frequency prediction unit 117. A frequency of the pulse generator 116 may range from several kHz to several tens of kHz. When the driving frequency is in the range of 13.56 MHz, the ON-time period T_ON and the OFF-time period T_OFF may be respectively about 50 psec. An operating time of a control loop or a unit time Δt may be about 1 usec.

The driving frequency prediction unit 117 may receive a start frequency f_start of a first pulse. In addition, the driving frequency prediction unit 117 may receive a threshold value for determining an optimal condition. In addition, the driving frequency prediction unit 117 may receive a specific number (m=r) of a control loop to perform frequency prediction or a hold-off time. The driving frequency prediction unit 117 may receive the phase-shifted admittance y' or the susceptance b' and the driving frequency f. The driving frequency prediction unit 117 may receive the phase-shifted reflection coefficient Γ' to be compared with the threshold value, and may calculate a prediction driving frequency only when the impedance matching condition is not satisfied.

The driving frequency prediction unit 117 may linearly fit an imaginary part b' of the phase-shifted admittance y', depending on a driving frequency in an n-th ON-time period T_ON(n), to set a frequency corresponding to a point, in which the imaginary part b' of the phase-shifted admittance y' is zero (0), as a prediction driving frequency.

The predicted driving frequency f(n+1,1) of the next ON-time period T_ON(n+1) may be given as follows:

$$f(n+1, m=1) = f(n, m=q) - b'(n, m=q)[df/db']$$

$$df/db' = [f(n, m=q) - f(n, m=r)]/[b'(n, m=q) - b'(n, m=r)] \qquad \text{Equation 3}$$

where f(n, m=r) denotes a drive frequency at a predetermined r-th processing number in the ON-time period T_ON(n) of an n-th pulse, b'(n,m=r) denotes susceptance of the phase-shifted admittance y' at the predetermined r-th processing number of the ON-time period T_ON(n) of the n-th pulse, f(n,m=q) denotes a driving frequency at the last processing number in the ON-time period T_ON(n) of the n-th pulse, and b'(n,m=q) denotes susceptance which is the imaginary part of the admittance y' of the last processing number q of the ON-time period T_ON(n) of the n-th pulse. In Equation 3, r may be a positive integer ranging from 3 to q−1, the total number q of control loops is T_ON/Δt, and q is a positive integer greater than or equal to 3.

Alternatively, the predicted driving frequency f(n+1,1) of the next ON-time period T_ON(n+1) may be given as follows:

$$f(n+1, m=1) = f(n, m=r) - b'(n, m=r)[df/db']$$

$$df/db' = [f(n, m=q) - f(n, m=r)]/[b'(n, m=q) - b'(n, m=r)] \qquad \text{Equation 4}$$

The driving frequency prediction unit 117 may provide the predicted driving frequency f(n+1, m=1) to the driving frequency control unit 113 to operate at a start driving frequency of an (N+1)-th ON-time period T_ON(n+1). Thus, high-speed frequency tuning impedance matching may be completed.

Hereinafter, an impedance matching method of a pulsed variable frequency RF generator will be described.

Returning to FIG. 7, the pulsed variable frequency RF generator 110 according to an example embodiment may provide RF power to the load 140 as a pulse of an ON-time period T_ON and an OFF-time period T_OFF, which are alternate, and includes a control loop varying a driving frequency in the ON-time period T_ON.

An impedance matching method of the pulsed variable frequency RF generator 110 includes varying a driving frequency f(n,m) in an ON-time period T_ON(n) of an n-th pulse (S101), predicting a driving frequency of an ON-time period T_ON(n+1) of an (n+1)-th pulse using admittance of the ON-time period T_ON(n) of the n-th pulse (S131), and providing an RF output of the pulsed variable frequency RF generator 110 as the predicted driving frequency f(n+1,1) in the ON-time T_ON(n+1) of the (n+1)-th pulse (S141). In this case, f(n,m) is a driving frequency in an m-th processing number (or a control loop) in the ON-time period T_ON(n) of the n-th pulse. n denotes a sequence number of a pulse, m is a positive integer between 1 and q. The total number q of the control loops is T_ON/Δt. q is greater than or equal to 3. m denotes an index indicating the processing number of the control loop for varying a driving frequency in the ON-time period T_ON.

First, a start driving frequency f_start of the first pulse, a duty ratio of a pulse, a period of the pulse, the total number q of control loops in one pulse, an operation time Δt of the control loop and an initial value of the index m indicating the processing number of the control loop are set (S110).

The step S101 of varying the driving frequency f(n,m) in the ON-time period T_ON(n) of the n-th pulse includes a first step S121, a second step S122 and S123, and a third step S126.

In step S121, an RF current signal I and an RF voltage signal V are measured at the output terminal of the pulse-type variable frequency RF generator 110 in the ON-time period T_ON(n) of the n-th pulse. The RF current signal I and the RF voltage signal V may be sensed by the impedance sensing unit 115.

In steps S122 and S123, the RF current signal I and the RF voltage signal V are used in the ON-time period T_ON(n) to calculate impedance Zi and a reflection coefficient Γi at an output terminal of the pulsed variable frequency RF generator, a phase-shifted reflection coefficient Γ', and phase-shifted admittance y'. The phase-shifted reflection coefficient Γ' reflects a phase caused by a transmission line. The phase-shifted reflection coefficient Γ' may be calculated by Equation 1. The impedance processing unit 111 may calculate impedance Zi, the reflection coefficient Γi, the phase-shifted reflection coefficient Γ' reflecting a phase caused by a transmission line, and the phase-shifted admittance y'.

In step S124, an optimal condition for impedance matching may be determined using the phase-shifted reflection coefficient Γ'. The driving frequency control unit 113 may determine an optimal condition for impedance matching using the phase-shifted reflection coefficient Γ'. The optimum condition may be determined by a magnitude of an absolute value of the phase-shifted reflection coefficient |Γ'| or the imaginary part Im(Γ') of the phase-shifted reflection coefficient Γ'. When the determined condition is an optimal condition, the first step S121 may be performed to measure the RF current signal I and the RF voltage signal V at the output terminal of the pulse-type variable frequency RF generator after increasing the index m indicating the processing number for tuning of the driving frequency. When the determined condition is not the optimal condition, the third step S126 may be performed to vary the driving frequency.

Specifically, when the imaginary part Im(Γ') of the phase-shifted reflection coefficient is within a threshold value (or the impedance matching is completed), the first step S121 may be performed to measure the RF current signal I and the RF voltage signal V at the output terminal of the pulsed variable frequency RF generator after increasing the index m indicating the processing number for tuning of a driving frequency (S124a). When the imaginary part Im(Γ') of the phase-shifted reflection coefficient is out of the threshold value, the third step S126 may be performed to vary the driving frequency.

In the third step S126, an increasing or decreasing direction of the driving frequency of the pulsed variable frequency RF generator is selected according to a sign of the imaginary part Im(Γ') of the phase-shifted reflection coefficient at the n-th ON-time period T_ON(n) and then the frequency is varied. Specifically, when the imaginary part Im(Γ') of the phase-shifted reflection coefficient has a positive value, the driving frequency is increased. Meanwhile, when the imaginary part Im(Γ') of the phase-shifted reflection coefficient has a negative value, the driving frequency is decreased. The variation amount df of the driving frequency may depend on the magnitude of the absolute value of the reflection coefficient |Γ'| or the magnitude of the imaginary part Im(Γ') of the reflection coefficient.

In step S125, a determination may be made as to whether the ON-time period T_ON(n) of the n-th pulse is finished. That is, when m>q, the ON-time period T_ON(n) is finished. When the ON-time period T_ON(n) is not finished, in step S126, an increasing or decreasing direction of the driving frequency of the pulsed variable frequency RF generator may be selected and the driving frequency may be varied depending on the sign of the imaginary part Im(Γ') of phase-shifted reflection coefficient in the ON-time period T_ON(n) of the n-th pulse.

The first step S121, the second step S122, S123, and the third step S126 may be repeated until the ON-time period T_ON(n) of the n-th pulse is finished.

When the ON-time period T_ON(n) is finished (m>q), in step S131, a driving frequency of an ON-time period T_ON (n+1) of an (n+1)-th pulse may be predicted using the admittance y' of the ON-time period T_ON(n) of the n-th pulse. The step S131 may include linearly fitting an imaginary part of the phase-shifted admittance y' in the n-th ON-time period T_ON(n) with respect to the driving frequency and setting a frequency corresponding to a point, in which the imaginary part of the phase-shifted admittance y' is zero (0), as a predicted driving frequency f(n+1,1) of an ON-time period T_ON(n+1) of the (n+1)-th pulse. The step S131 may be selectively performed only when impedance matching is not completed.

The prediction driving frequency f(n+1, m=1) of the ON-time period T_ON(n+1) of the (n+1)-th pulse may be given by Equation 3 or Equation 4. When m=1, a stability of plasma, a load, may be reduced due to a start time of a pulse to measure unstable impedance. Accordingly, the prediction driving frequency to be used in the ON-time period T_ON (n+1) of the (n+1)-th pulse may be used by processing data measured in a predetermined r-th processing number and data measured in a last q-th processing number. That is, r may be a positive integer of 3 to q−1.

After the driving frequency of the ON-time period T_ON (n+1) of the (n+1)-th pulse is predicted, time delay may be performed for an OFF-time period T_OFF (S132).

Then, for the next pulse, set n-n+1 and a processing number index of a control loop is set to m=1 (S133).

Then, RF power is output at a prediction driving frequency f(n+1,1) of the ON-time period T_ON(n+1) of the (n+1)-th pulse (S141).

Then, the control loop is repeated q times in the (n+1)-th pulse until an (n+2)-th pulse starts.

Referring to FIG. 8, a pulsed variable frequency RF generator 110 provides RF power to the load 140 as an ON-time period T_ON and an OFF-time period T_OFF which are alternate. The pulse generator 116 generates a pulse signal of an ON-time period T_ON and an OFF-time period T_OFF which are alternate. The pulse signal may have a period of about 100 usec.

A driving frequency of the pulsed variable frequency RF generator 110 starts at a start driving frequency f_start of a first pulse to have a driving frequency of f(n,m=1) in a control loop of m=1 of an n-th pulse. When an imaginary part Im(Γ') of a phase-shifted reflection coefficient has a negative value, the driving frequency is decreased depending on time. A driving frequency f(n+1,m=1) to be used in a control loop of m=1 of an (n+1)-th pulse is predicted by using a driving frequency and susceptance b' in a control loop of m=r and a control loop of m=q. That is, a start driving frequency of the next pulse is predicted using a driving frequency and susceptance b' of a previous pulse. Accordingly, high-speed frequency tuning impedance matching or optimum frequency setting may be completed. According to the present disclosure, impedance matching is completed within one to three pulses.

Referring to FIG. 9, a variable range of the driving frequency of the pulse-type variable frequency RF generator 110 may be 12.88 MHz to 14.24 MHz. A matched frequency was 13.56 MHz and a real part of impedance Z', including an impedance matching network 130 and a load 140, was set to 50 ohms. A phase-shifted reflection coefficient Γ' or phase-shifted admittance y' is shown on the Smith chart. An optimal impedance matching position is a frequency at which an imaginary part of the reflection coefficient Γ' is "0". On the Smith chart, susceptance b' increases from a negative value to zero as the driving frequency increases from 12.88 MHz. Meanwhile, the susceptance b' decreases from a positive value to zero as the driving frequency decreases from 14.24 MHz.

In a conductance circle in which g'=1, as the drive frequency is increased, the susceptance b' rotates clockwise along the circle and an absolute value of the susceptance b' gradually approaches zero. When the absolute value of the susceptance b' reaches zero, impedance matching is achieved.

Referring to FIGS. 10 and 11, solid line indicates susceptance b' depending on a driving frequency when a real part of impedance Z' of the impedance matching network 130 and the load 140 are 50 ohm. As the driving frequency increase from 12.88 MHz, the susceptance b' increases from a negative value to zero. f(n,m=r) denotes a driving frequency of an m-th control loop in an ON-time period T_ON(n) of an n-th pulse. f_match denotes a driving frequency at which impedance matches. Dotted line is straight line connecting susceptance at f(n,m=r) and susceptance at f(n,m=q). A frequency of a position, in which the straight line is the zero, is a predicted matching frequency expected in the ON-time period of the (n+1)-th pulse. The frequency f (n+1,m=1), at which the susceptance b' of the straight line connecting r and q to is zero "0", is a prediction matching frequency and becomes a start driving frequency of the next pulse.

When a prediction driving frequency, obtained using data (or susceptance) in an ON-time period of an n-th pulse, is used as a start driving frequency of the ON-time period of an (n+1)-th pulse, frequency tuning impedance matching is completed at high speed.

Figure 12:
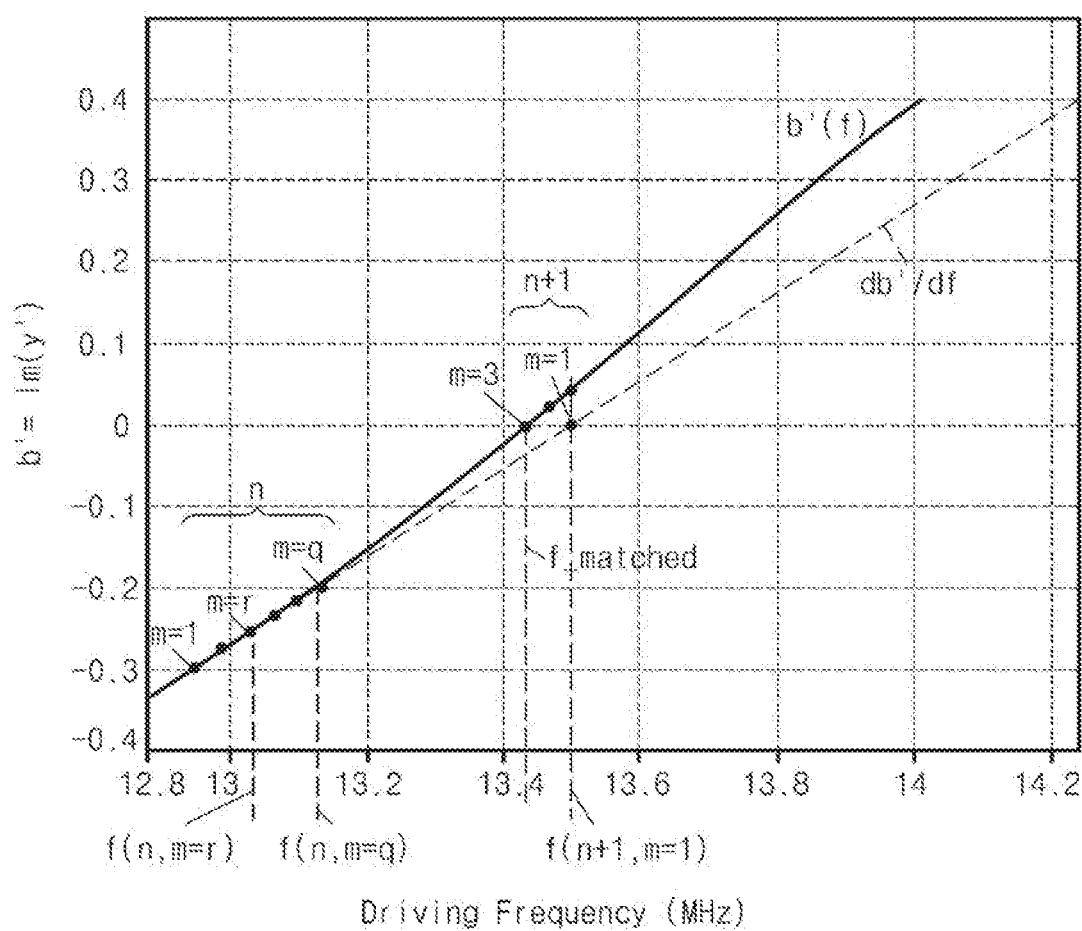
FIG. 12 illustrates an imaginary part of admittance depending on a driving frequency according to another example embodiment of the present disclosure.

FIG. 12 illustrates an imaginary part of admittance depending on a driving frequency according to another example embodiment of the present disclosure.

Figure 13:
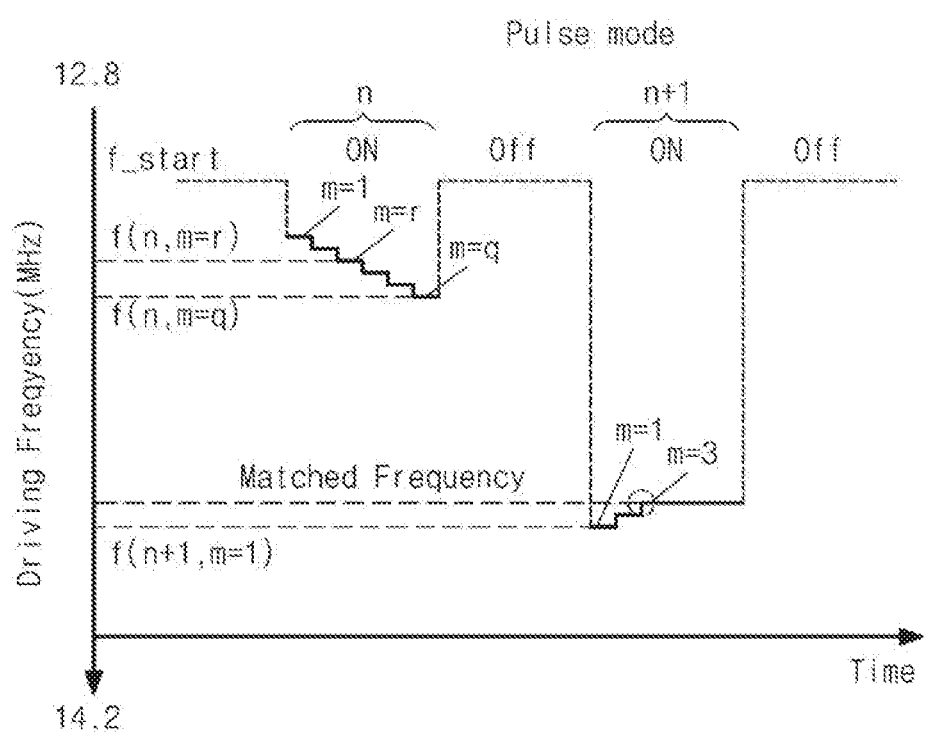
FIG. 13 illustrates variation of a driving frequency depending on operating time of a control loop in FIG. 12.

FIG. 13 illustrates variation of a driving frequency depending on operating time of a control loop in FIG. 12.

Referring to FIGS. 12 and 13, solid line indicates susceptance b' depending on a driving frequency when a real part of impedance Z' of impedance matching network and a load is 50 ohm. As the drive frequency increases from 12.88 MHz, the susceptance b' increases from a negative value to zero. f(n,m=r) denotes a driving frequency of an m-th control loop in an ON-time period T_ON(n) of an n-th pulse. f_match denotes a driving frequency at which the impedance matches. Dotted line is straight line connecting susceptance at f(n,m=r) and the susceptance at f(n,m=q). A driving frequency of a point, in which a straight line connecting r and q is zero, is a prediction driving frequency expected in an ON-time period of the (n+1)-th pulse. A driving frequency, at which susceptance b' of the straight line connecting r and q is "0", is f(n+1,1). The driving frequency f(n+1,1) is greater than f_match (13.56 MHz).

An imaginary part Im(Γ') of a reflection coefficient at a prediction driving frequency of an ON-time period of the (n+1)-th pulse has a positive value. Therefore, in the ON-time period of the (n+1)-th pulse, the driving frequency decreases as a control loop operates.

When the prediction driving frequency, obtained using data (or susceptance) of an ON-time period of an n-th pulse, is used as a start driving frequency of the ON-time period of the (n+1)-th pulse, frequency tuning impedance matching is completed at high speed.

Figure 14:
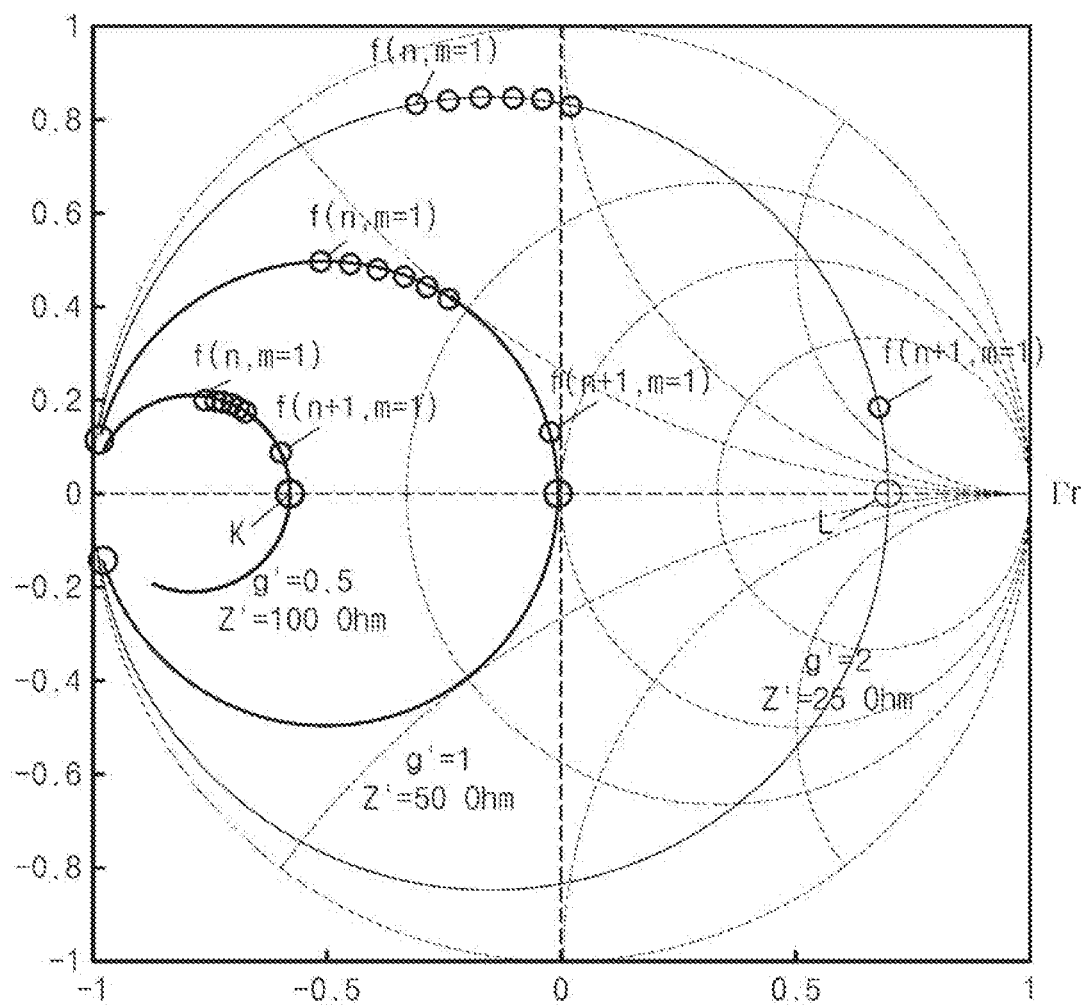
FIG. 14 is a Smith chart illustrating a load and variation in impedance Z' of an impedance matching network according to another example embodiment of the present disclosure.

FIG. 14 is a Smith chart illustrating a load and variation in impedance Z' of an impedance matching network according to another example embodiment of the present disclosure.

Figure 15:
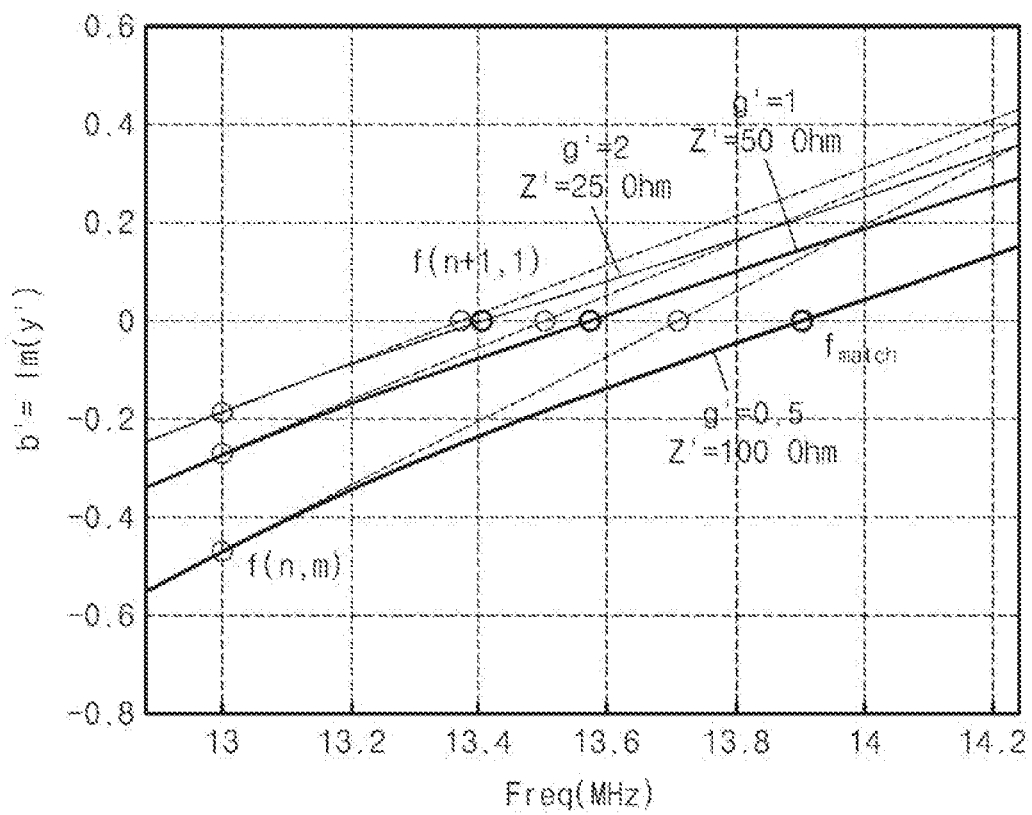
FIG. 15 is a graph illustrating susceptance, shown on the Smith chart in FIG. 14, depending on a driving frequency.

FIG. 15 is a graph illustrating susceptance, shown on the Smith chart in FIG. 14, depending on a driving frequency.

Referring to FIGS. 14 and 15, a conductance circle, in which g'=1, is a case in which a real part Re(Z') of impedance Z' is 50 ohms. A circle, in which g'=0.5, is a case in which a real part Re(Z') of impedance is 100 ohms. A circle, in which g'=2, is a case in which a real part of the impedance Re(Z') of impedance is 25 ohms.

A pulsed variable frequency RF generator may operate even when a real part Re(Z') of the impedance is not 50 ohms. That is, impedance matching is not completed, but there is a driving frequency at which an absolute value of a reflection coefficient |Γ'| is significantly decreased. In the circle in which g'=0.5, a position K is a point in which an imaginary part Im(Γ') of a reflection coefficient is zero and may be used as an optimal frequency position, instead of an impedance matching condition. In the circle in which g'=2, a position L position is the point in which an imaginary part Im(Γ') of a reflection coefficient becomes zero and may be used as an optimal frequency position instead of an impedance matching condition.

Returning to FIG. 7, in step S124, an optimal condition for impedance matching may be determined using the phase-shifted reflection coefficient Γ'. The optimal condition is determined by the absolute value |Γ'| of the phase-shifted reflection coefficient or the magnitude of the imaginary part Im(Γ') of the phase-shifted reflection coefficient. For example, when the absolute value of the imaginary part Im(Γ') of the phase-shifted reflection coefficient Γ' is less than or equal to a threshold value, the optimum condition is determined. When the impedance matching is not completed, the optima condition is determined depending on whether the imaginary part Im(Γ') of the reflection coefficient is zero (or less than or equal to a threshold value).

Accordingly, when the imaginary part Im(Γ') of the reflection coefficient is zero, it is an optimum driving frequency in the present situation. As a result, the driving frequency may be maintained at the optimum driving frequency.

On the other hand, when the real part of the impedance has a value greater than 50 ohms, an error of the predicted driving frequency may be increased. However, this error be reached by a control loop algorithm in a single pulse. When f_match is not reached even in the (n+1)-th pulse, an algorithm for predicting a driving frequency is performed every pulse to reach the optimal driving frequency in an (n+2)-th pulse.

The pulsed variable frequency RF generator may operate at an optimal driving frequency by varying a driving frequency. The impedance matching network 130 is disposed between the pulsed variable frequency RF generator 110 and the load 140, and includes at least two variable reactance elements. The impedance matching network 130 changes a reactance value of the variable reactance element for complete impedance matching. Accordingly, the real part Re(Z') of the impedance in the load direction may be changed to characteristic impedance $Z_0$ of a transmission line at an input terminal N2 of the impedance matching network 130. As a result, the impedance Z' is present on a conductance circle, in which g'=1, and the pulsed variable frequency RF generator 110 may complete impedance matching.

Figure 16:
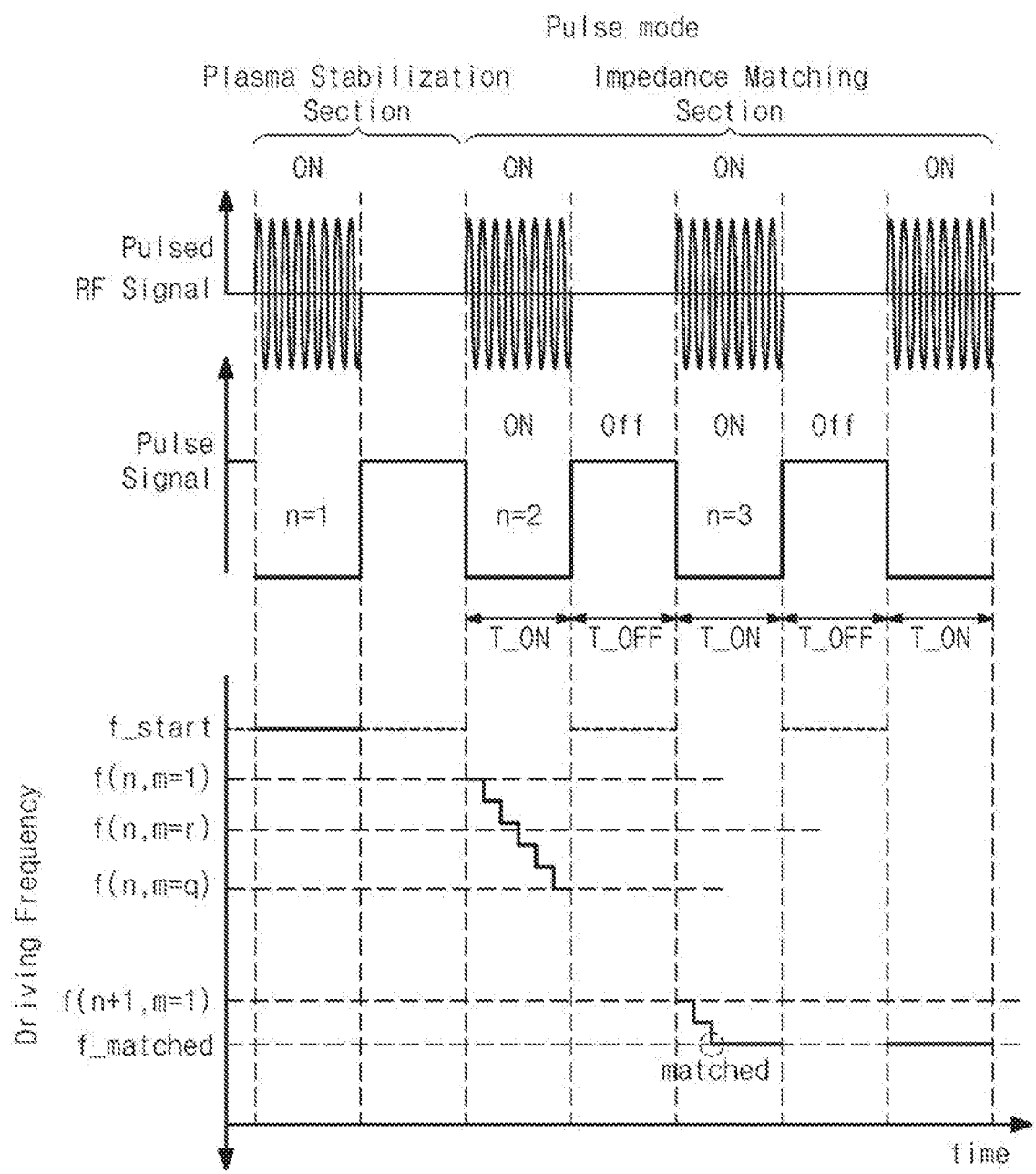
FIG. 16 illustrates a pulse sequence according to another example embodiment of the present disclosure.

FIG. 16 illustrates a pulse sequence according to another example embodiment of the present disclosure.

Referring to FIG. 16, before an algorithm for predicting a driving frequency of the present disclosure is performed, at least a pulse, in which an algorithm for predicting the driving frequency is not performed, may be transmitted to a load. Such a pulse may stabilize plasma through initial discharging. During a plasma stabilization period, the driving frequency may operate at a predetermined start driving frequency f_start. A step of stabilizing plasma, including an ON-time period T_ON and an OFF-time period T_OFF which are alternate, without variation of a driving frequency of the pulsed variable frequency RF generator, may be included.

As described above, a control method of a driving frequency of a pulsed variable frequency RF generator according to an example embodiment may complete impedance matching at higher speed than a conventional frequency control method and may operate at an optimal frequency at which a reflected wave is significantly reduced even when the impedance matching is not completed.

Although the present disclosure and its advantages have been described in detail, it should be understood that various changes, substitutions and alterations can be made herein without departing from the spirit and scope of the disclosure as defined by the following claims.

What is claimed is:

1. A control method of a driving frequency of a pulsed variable frequency RF generator providing RF power to a load as a pulse of an ON-time period T_ON and an OFF-time period T_OFF, which are alternate, and including a control loop varying the driving frequency in the ON-time period T_ON, the control method comprising:
   varying the driving frequency f(n,m) in an ON-time period T_ON(n) of an n-th pulse;
   predicting the driving frequency of an ON-time period T_ON(n+1) of an (n+1)-th pulse using admittance of the ON-time period T_ON(n) of the n-th pulse; and
   providing an RF output of the pulsed variable frequency RF generator as the predicted driving frequency f(n+1,1) in the ON-time T_ON(n+1) of the (n+1)-th pulse,
   wherein f(n,m) is the driving frequency in an m-th processing number in the ON-time period T_ON(n) of the n-th pulse,
   n denotes a sequence number of a pulse,
   m is a positive integer of 1 to q, and
   m denotes an index indicating the processing number of the control loop for varying the driving frequency in the ON-time period T_ON.

2. The control method as set forth in claim 1, wherein the varying the driving frequency f(n,m) in an ON-time period T_ON(n) of an n-th pulse comprises:
   a first step of measuring an RF current signal I and an RF voltage signal V at an output terminal of the pulsed variable frequency RF generator in the ON-time period T_ON(n) of the n-th pulse;
   a second step of calculating impedance Zi and a reflection coefficient Γi at the output terminal of the pulsed variable frequency RF generator by using the RF current signal I and the RF voltage signal V in the ON-time period T_ON(n) of the n-th pulse, a phase-shifted reflection coefficient Γ' reflecting a phase caused by a transmission line, and phase-shifted admittance y'; and
   a third step of selecting an increasing or decreasing direction of the driving frequency of the pulsed variable frequency RF generator depending on a sign of an imaginary part Im(Γ') of the phase-shifted reflection coefficient in the ON-time period T_ON(n) of the n-th pulse and varying the driving frequency, and
   the first step, the second step, and the third step are repeated until the ON-time period T_ON(n) of the n-th pulse is finished.

3. The control method as set forth in claim 2, wherein the predicting the driving frequency of an ON-time period T_ON(n+1) of an (n+1)-th pulse using admittance of the ON-time period T_ON(n) of the n-th pulse comprises:
   linearly fitting an imaginary part of the phase-shifted admittance y' in an n-th ON-time period T_ON(n) with respect to the driving frequency; and
   setting a frequency corresponding to a point, in which the imaginary part of the phase-shifted admittance y' is zero (0), as a predicted driving frequency f(n+1,1) of an ON-time period T_ON(n+1) of an (n+1)-th pulse.

4. The control method as set forth in claim 3, wherein the predicted driving frequency f(n+1,m=1) of the ON-time period T_ON(n+1) of the (n+1)-th pulse is given as follows:

$$f(n+1,m=1)=f(n,m=q)-b'(n,m=q)[df/db']$$

$$df/db'=[f(n,m=q)-f(n,m=r)]/[b'(n,m=q)-b'(n,m=r)],$$

where f(n,m=r) denotes the driving frequency at a predetermined r-th processing number in the ON-time period T_ON(n) of an n-th pulse,
   b'(n,m=r) denotes susceptance which is the imaginary part of the phase-shifted admittance y' at the predetermined r-th processing number of the ON-time period T_ON(n) of the n-th pulse,
   f(n,m=q) denotes the driving frequency at the last processing number in the ON-time period T_ON(n) of the n-th pulse, and
   b'(n,m=q) denotes susceptance which is the imaginary part of the admittance y' of the last processing number q of the ON-time period T_ON(n) of the n-th pulse.

5. The control method as set forth in claim 4, wherein r is a positive integer of 3 to q−1.

6. The control method as set forth in claim 2, further comprising:
   determining an optimal condition for impedance matching using the phase-shifted reflection coefficient Γ',
   wherein the optimal condition is determined by an absolute value |Γ'| of the phase-shifted reflection coefficient or a magnitude of the imaginary part Im(Γ') of the phase-shifted reflection coefficient Γ',
   when the determined condition is the optimal condition, the first step of measuring an RF current signal I and an RF voltage signal V at an output terminal of the pulsed variable frequency RF generator is performed after increasing an index m indicating a processing number for variation of the driving frequency, and when the determined condition is not the optimal condition, the third step of varying the driving frequency is performed.

7. The control method as set forth in claim 2, wherein the third step of selecting an increasing or decreasing direction of the driving frequency of the pulsed variable frequency RF generator depending on a sign of an imaginary part Im(Γ") of the phase-shifted reflection coefficient in the ON-time period T_ON(n) of the n-th pulse and varying the driving frequency comprises:

the driving frequency is increased when the imaginary part Im(Γ") of the phase-shifted reflection coefficient has a positive value, and the driving frequency is decreased when the imaginary part Im(Γ") of the phase-shifted reflection coefficient has a negative value.

8. The control method as set forth in claim 7, wherein a variation amount of the driving frequency in the n-th ON-time period T_ON(n) depends on an absolute value of the phase-shifted reflection coefficient or an absolute value of the imaginary part of the phase-shifted reflection coefficient.

9. The control method as set forth in claim 1, further comprising:

changing a reactance value of a variable reactance element of an impedance matching network, which is disposed between the pulsed variable frequency RF generator and the load and includes at least two variable reactance elements, to set a real part Re(Zi) of the impedance in the load direction at the output terminal of the pulsed variable frequency RF generator as characteristic impedance of a transmission line.

10. The control method as set forth in claim 1, further comprising:

a plasma stabilizing step, including an ON-time period T_ON and an OFF-time period T_OFF which are alternate, without variation of the driving frequency of the pulsed variable frequency RF generator.

11. A pulsed variable frequency RF power system comprising a pulsed variable frequency RF generator configured to supply RF power to a load as a pulse of an ON-time period T_ON and an OFF-time period T_OFF which are alternate, wherein the pulsed variable RF generator comprises:

an impedance sensing unit disposed at an output terminal of the pulsed variable frequency RF generator in an n-th ON-time period T_ON(n) to sense an RF current signal and an RF voltage signal;

an impedance processing unit configured to calculate impedance Zi and a reflection coefficient Γi by using the RF current signal and the RF voltage signal at the output terminal of the pulsed variable frequency RF generator, a phase-shifted reflection coefficient Γ" by a transmission line between the load and the pulsed variable frequency RF generator, and phase-shifted admittance y' converted from the phase-shifted reflection coefficient Γ" in the n-th ON-time period T_ON(n);

a driving frequency prediction unit configured to predict a next ON-time period T_ON(n+1) using the phase-shifted admittance y' with respect to a driving frequency;

a driving frequency control unit configured to receive a predicted driving frequency and set the predicted driving frequency as a start driving frequency of the next ON-time period T_ON(n+1) and to control the driving frequency using the phase-shifted reflection coefficient Γ";

a pulse generator configured to generate a pulse signal and divide the ON-time period T_ON and the OFF-time period T_OFF and to provide the pulse signal to the driving frequency prediction unit and the driving frequency control unit; and an RF amplifier configured to amplify a sinusoidal wave of the driving frequency of the driving frequency control unit.

12. The pulsed variable frequency RF power system as set forth in claim 11, wherein the driving frequency prediction unit linearly fits an imaginary part of phase-shifted admittance y' with respect to the driving frequency, in an n-th ON-time period T_ON(n) to set a frequency, corresponding to a point in which the imaginary part of the phase-shifted admittance y' is zero, as the predicted driving frequency.

* * * * *